United States Patent
Minowa et al.

(10) Patent No.: US 9,716,011 B2
(45) Date of Patent: Jul. 25, 2017

(54) METHOD OF MANUFACTURING SEMICONDUCTOR DEVICE AND APPARATUS FOR MANUFACTURING SEMICONDUCTOR DEVICE

(71) Applicant: CANON KABUSHIKI KAISHA, Tokyo (JP)

(72) Inventors: Masaaki Minowa, Kawasaki (JP); Takayuki Sumida, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/590,170

(22) Filed: Jan. 6, 2015

(65) Prior Publication Data
US 2015/0214065 A1    Jul. 30, 2015

(30) Foreign Application Priority Data
Jan. 27, 2014   (JP) .................................. 2014-012764

(51) Int. Cl.
| | |
|---|---|
| *H01L 21/302* | (2006.01) |
| *H01L 21/461* | (2006.01) |
| *H01B 13/00* | (2006.01) |
| *C03C 15/00* | (2006.01) |
| *C03C 25/68* | (2006.01) |
| *C23F 1/00* | (2006.01) |
| *H01L 21/306* | (2006.01) |
| *H01L 21/311* | (2006.01) |
| *H01L 21/67* | (2006.01) |

(Continued)

(52) U.S. Cl.
CPC .. *H01L 21/30604* (2013.01); *H01L 21/02123* (2013.01); *H01L 21/311* (2013.01); *H01L 21/31116* (2013.01); *H01L 21/4832* (2013.01); *H01L 21/67017* (2013.01); *H01L 21/67063* (2013.01); *H01L 23/5381* (2013.01); *H05K 3/007* (2013.01)

(58) Field of Classification Search
None
See application file for complete search history.

(56) References Cited

U.S. PATENT DOCUMENTS

| | | | |
|---|---|---|---|
| 8,278,725 B2 | 10/2012 | Tripathy et al. | |
| 2005/0059254 A1* | 3/2005 | Shi ...................... | B81C 1/00531 438/709 |

(Continued)

FOREIGN PATENT DOCUMENTS

| | | |
|---|---|---|
| JP | 2010-509081 A | 3/2010 |
| JP | 2013-506284 A | 2/2013 |

*Primary Examiner* — Stephanie Duclair
(74) *Attorney, Agent, or Firm* — Fitzpatrick, Cella, Harper & Scinto

(57) ABSTRACT

A method of manufacturing a semiconductor device, the method, comprising a first etching step of etching a substrate on which a silicon member and a compound member containing nitrogen and silicon are exposed, by using a first etching gas containing $XeF_2$ and $H_2$, and a second etching step of etching the substrate by using a second etching gas containing $XeF_2$, wherein the second etching gas satisfies at least one of (i) a condition that the second etching gas is lower in a partial pressure of $H_2$ than the first etching gas, and (ii) a condition that the second etching gas is smaller in a quantity of flow of $H_2$ than the first etching gas.

14 Claims, 8 Drawing Sheets

(51) Int. Cl.
*H01L 21/02* (2006.01)
*H01L 21/48* (2006.01)
*H05K 3/00* (2006.01)
*H01L 23/538* (2006.01)

(56) References Cited

U.S. PATENT DOCUMENTS

| | | |
|---|---|---|
| 2010/0193781 A1 | 8/2010 | Tripathy et al. |
| 2010/0197063 A1* | 8/2010 | Bluzer .................. B81B 3/0081 438/51 |
| 2012/0238101 A1 | 9/2012 | O'Hara |
| 2013/0059440 A1* | 3/2013 | Wang .................. H01L 21/3065 438/694 |

* cited by examiner

| CONDITION | QUANTITY OF FLOW [sccm] | | | TOTAL PRESSURE [Torr] | PARTIAL PRESSURE [Torr] | | |
|---|---|---|---|---|---|---|---|
| | $N_2$ | $XeF_2$ | $H_2$ | | $N_2$ | $XeF_2$ | $H_2$ |
| a | 52 | 21 | 0 | 9.5 | 6.7 | 2.8 | 0.0 |
| b | 52 | 21 | 10 | 9.5 | 5.9 | 2.4 | 1.2 |
| c | 52 | 21 | 30 | 9.5 | 4.8 | 2.0 | 2.8 |
| d | 52 | 21 | 0 | 7 | 5.0 | 2.0 | 0.0 |
| e | 52 | 21 | 10 | 8 | 5.0 | 2.0 | 1.0 |

METHOD OF MANUFACTURING SEMICONDUCTOR DEVICE AND APPARATUS FOR MANUFACTURING SEMICONDUCTOR DEVICE

BACKGROUND OF THE INVENTION

Field of the Invention

The present invention relates to a method of manufacturing a semiconductor device and an apparatus for manufacturing a semiconductor device.

Description of the Related Art

Japanese Patent Laid-Open No. 2013-506284 discloses a technique of, when performing dry etching on a substrate on which silicon and silicon nitride are exposed, using $XeF_2$ as an etching gas and adding $H_2$ to the etching gas. According to Japanese Patent Laid-Open No. 2013-506284, adding $H_2$ to an etching gas will increase the etching selectivity of silicon to silicon nitride.

However, the above etching method has a problem that the etching rate of silicon decreases.

SUMMARY OF THE INVENTION

The present invention provides a technique advantageous in increasing the etching rate and etching selectivity of a silicon member.

One of the aspects of the present invention provides a method of manufacturing a semiconductor device, the method, comprising a first etching step of etching a substrate on which a compound member containing nitrogen and silicon and a silicon member are exposed, by using a first etching gas containing $XeF_2$ and $H_2$, and a second etching step of etching the substrate by using a second etching gas containing $XeF_2$ after the first etching step, wherein the second etching gas used in the second etching step satisfies at least one of a condition that the second etching gas used in the second etching step is lower in a partial pressure of $H_2$ than the first etching gas used in the first etching step, and a condition that the second etching gas used in the second etching step is smaller in a quantity of flow of $H_2$ than the first etching gas used in the first etching step.

Further features of the present invention will become apparent from the following description of exemplary embodiments with reference to the attached drawings.

DESCRIPTION OF THE EMBODIMENTS (1. First Embodiment)

The first embodiment will be described with reference to FIGS. 1 to 7B.

(1.1 Example of Arrangement of Etching Apparatus)

Figure 1:
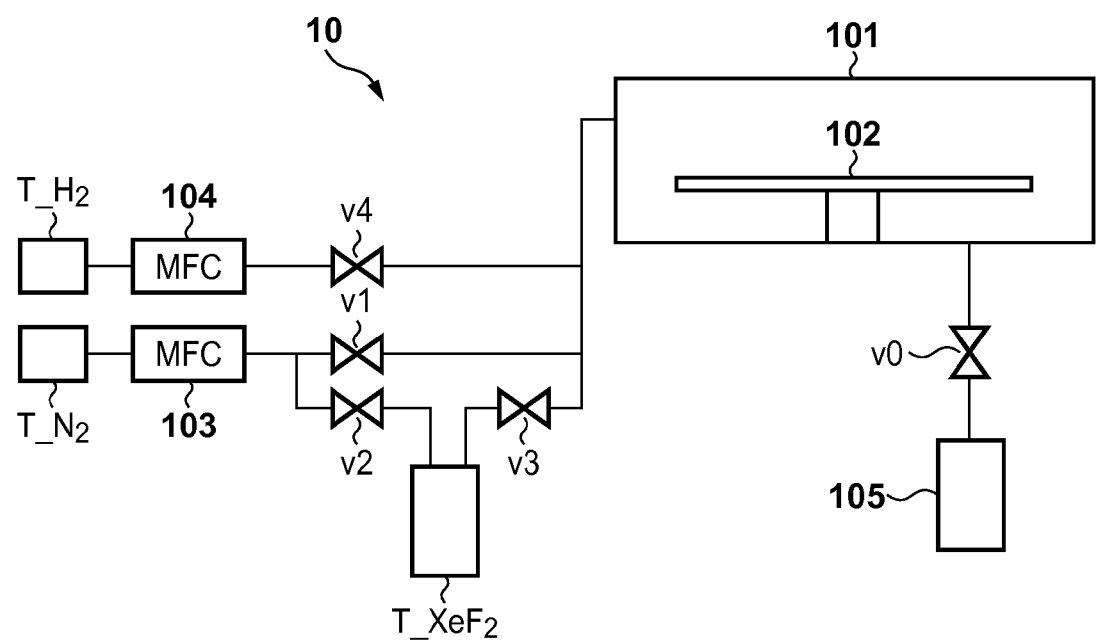
FIG. 1 is a block diagram for explaining an example of the system configuration of an etching apparatus.

FIG. 1 shows an example of the system configuration of an etching apparatus 10 for performing dry etching. The etching apparatus 10 includes a chamber 101, a vacuum pump 105, and at least one etching gas supply unit ($T\_N_2$ and the like).

The chamber 101 is provided with a stage 102 for holding an etching target. Controlling the temperature of the stage 102 can adjust the temperature at the time of etching an etching target placed in the chamber 101. The temperature of the stage 102 during etching can be set within the range of, for example, −5° C. to 40° C.

The vacuum pump 105 reduces the pressure in the chamber 101 to set it in a nearly vacuum state (set the total pressure in the chamber 101 to a predetermined value) by opening a valve v0.

Each supply unit $T\_N_2$ and the like are in fluid communication with the chamber 101 by opening corresponding valves v1 to v4. The supply unit $T\_N_2$ can supply $N_2$ (nitrogen) into the chamber 101 by opening the valve v1. In this embodiment, $N_2$ is a carrier gas used for etching.

A supply unit $T\_XeF_2$ is provided between the supply unit $T\_N_2$ and the chamber 101. The supply unit $T\_XeF_2$ can supply $XeF_2$ (xenon difluoride) into the chamber 101 by opening the valves v2 and v3.

In this case, $XeF_2$ is a solid at normal temperature and partially sublimated when $N_2$ as a carrier gas passes $XeF_2$. The sublimated gas is then supplied into the chamber 101, together with $N_2$. For example, when the quantity of flow of $N_2$ is 50 sccm, the quantity of flow of $XeF_2$ is about 20 sccm.

When an etching target is silicon, the reaction formula at the time of etching is given by

$$Si + 2XeF_2 \rightarrow SiF_4 + 2Xe \qquad (1)$$

Note that $N_2$ as a carrier gas does not contribute to the above reaction.

A supply unit $T\_H_2$ can supply $H_2$ (hydrogen) into the chamber 101 by opening the valve v4. That is, with this arrangement, when silicon is etched, $N_2$ and $XeF_2$ are supplied into the chamber 101, and $H_2$ is added to the gas mixture.

In addition, the etching apparatus 10 includes MFCs (Mass Flow Controllers) 103 and 104 in correspondence with the supply unit $T\_N_2$ and the supply unit $T\_H_2$. The MFCs 103 and 104 can control the quantities of flow of corresponding etching gases.

The etching apparatus 10 has the above arrangement. While the etching apparatus 10 is performing etching, it is possible to suck or remove reaction products ($SiF_4$ and Xe) by the vacuum pump 105 while supplying an etching gas from each supply unit $T\_N_2$ into the chamber 101.

(1.2 Example of Method of Manufacturing Bolometer)

An example of a method of manufacturing a semiconductor device will be described below with reference to FIGS. 2A to 2C. In this case, a bolometer will be exemplified as a semiconductor device. A bolometer is a detection element which detects far-infrared radiation or the like based on a resistance change caused by a temperature change upon reception of the far-infrared radiation or the like. For example, a sensor for acquiring a thermal image can be obtained by arraying a plurality of bolometers 20. This sensor is used in, for example, an image capturing apparatus such as a thermography camera or monitoring camera.

Figure 2A:
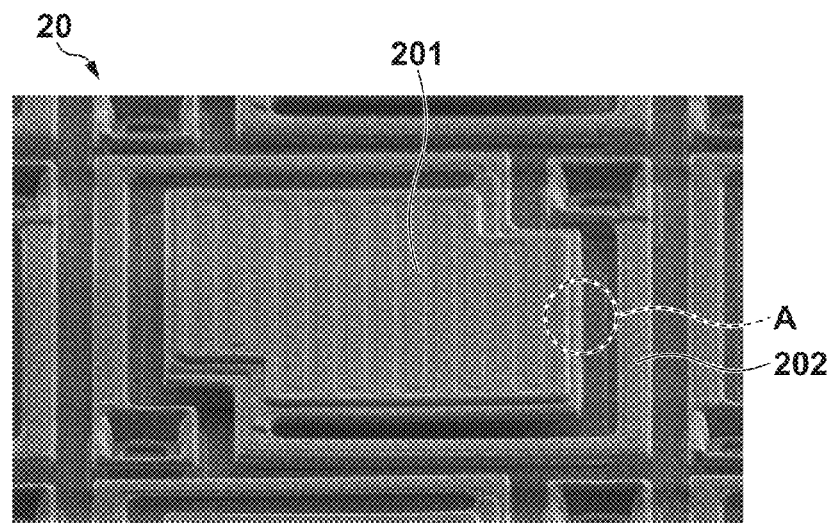
FIGS. 2A to 2C are views for explaining an example of the arrangement of a bolometer and an example of a manufacturing method.

FIG. 2A shows an SEM photo (bird's eye view) of the bolometer 20 corresponding to one pixel. FIG. 2B is a schematic view of the upper surface of the bolometer 20.

The bolometer 20 includes a sensor unit 201 for absorbing far-infrared radiation or the like, a pair of beams 202, that is, $202_A$ and $202_B$, which fix the sensor unit 201, a metal pattern 205, and a pair of electrodes E, that is, $E_A$ and $E_B$. The sensor unit 201 is fixed above a substrate (to be referred to as a substrate SUB hereinafter) by the pair of beams 202. That is, the sensor unit 201 is fixed at a position, for example, several μm away from the upper surface of the substrate SUB. With this structure, the sensor unit 201 is thermally separated from the substrate SUB. This structure is obtained by, for example, forming the sensor unit 201, the beams 202, and the like on a sacrificial layer on the substrate SUB and then removing the sacrificial layer afterward by isotropic etching.

Note that the substrate SUB is provided with a readout unit for reading out signals from the bolometer 20. The readout unit can include, for example, not only a signal amplifying circuit and a sample/hold circuit but also driving circuits and control circuits which drive and control these circuits.

Figure 2B:
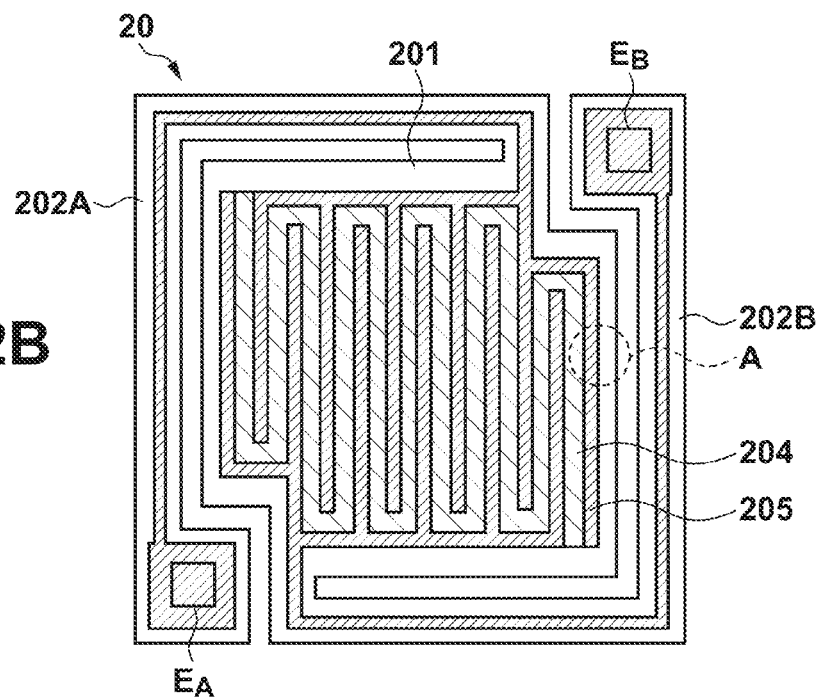
Figure 2C:
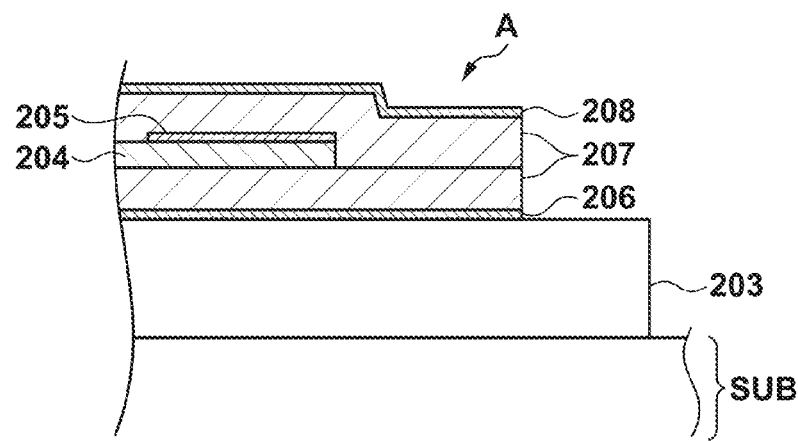

FIG. 2C is a schematic view for explaining a sectional structure of a portion A indicated by the broken lines in FIGS. 2A and 2B. For the sacrificial layer, for example, amorphous silicon 203 (a-Si) is used. The amorphous silicon 203 is etched by an etching gas containing $XeF_2$ described above. The sensor unit 201 is configured such that a bolometer film 204 which detects a temperature change caused by far-infrared radiation or the like and the metal pattern 205 which electrically connects the bolometer film 204 to an electrode E are sandwiched between silicon nitride films 207 ($Si_3N_4$). Silicon oxide films 206 and 208 ($SiO_2$) are respectively provided on the upper and lower surfaces of the silicon nitride films 207. The silicon nitride films 207 and silicon oxide films 206 and 208 mainly absorb far-infrared radiation and the like. For the bolometer film 204, a material having large temperature dependence of electrical resistance (for example, amorphous silicon) is used to detect a temperature change caused by the absorption of far-infrared radiation with high sensitivity.

Before the amorphous silicon 203 is etched, the end portions of the sensor unit 201 and beams 202 include portions where the silicon nitride films 207 are exposed.

In this case, the ratio of the etching rate of an etching target to the etching rate of a member other than the etching target is called the "etching selectivity". That is, the higher the etching selectivity, the more difficult the member other than the etching target is to etch, and vice versa.

When the amorphous silicon 203 is simply etched by using $XeF_2$, the etching selectivity to the silicon oxide films 206 and 208 is about 10000, whereas the etching selectivity to the silicon nitride films 207 is about 500 at most. That is, when the amorphous silicon 203 is simply etched by using $XeF_2$, the silicon oxide films 206 and 208 are hardly etched, but a considerable amount of the silicon nitride films 207 is etched together with the amorphous silicon 203.

As described above, before the amorphous silicon 203 is etched, the end portions of the sensor unit 201 and beams 202 include portions where the silicon nitride films 207 are exposed. For this reason, when etching is simply performed by using $XeF_2$, the silicon nitride films 207 are etched from the side surface side at the time of removal of the amorphous silicon 203 as a sacrificial layer.

In this case, adding $H_2$ to the etching gas will increase the etching selectivity. As a consequence, the silicon nitride films 207 are hardly etched (see patent literature 1 described above). However, adding $H_2$ to the etching gas will decrease the etching rate of the amorphous silicon 203.

Figure 3:
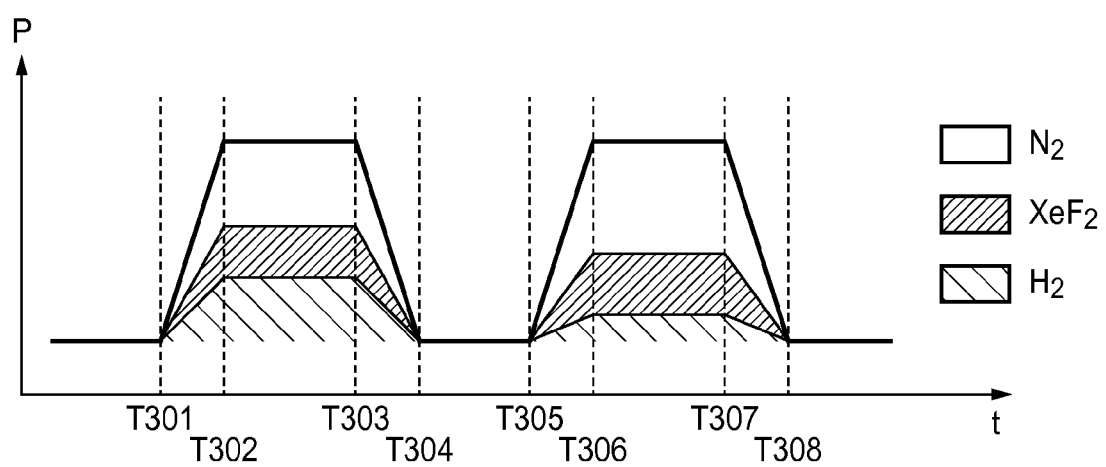
FIG. 3 is a timing chart for explaining an example of an etching step.

In this embodiment, therefore, as indicated by the timing chart exemplified in FIG. 3, etching is performed twice under different etching conditions. FIG. 3 is a timing chart for explaining an etching step according to the embodiment. The ordinate represents a pressure P in the chamber 101, and the abscissa represents a time t.

Before time T301, the valve v0 is open, and the interior of the chamber 101 is set in a nearly vacuum state by the vacuum pump 105. The valve v0 is gradually closed from time T301, and an etching gas is supplied into the chamber 101 in the interval between times T301 and T302. Thereafter, in the interval between times T302 and T303, the valve v0 is partially open, and the pressure in the chamber 101 is maintained almost constant (for example, 9.5 Torr). The valve v0 is gradually closed from time T303 to reduce the pressure in the chamber 101. At time T304, the valve v0 is fully open to set the interior of the chamber 101 in a nearly vacuum state again. The etching step of the amorphous silicon 203 at times T301 to T304 described above is called the "first etching step".

Subsequently, at times T305 to T308, the "second etching step" is performed by opening/closing the valve in the same manner as at times T301 to T304 described above.

The first and second etching steps differ in the partial pressures or quantities of flow of the respective gases in each etching gas.

As described above, each etching gas contains $N_2$, $XeF_2$, and $H_2$. Assume that in the etching gas in the first etching step, the partial pressure of $N_2$ is represented by $P_1(N_2)$, the partial pressure of $XeF_2$ is represented by $P_1(XeF_2)$, the partial pressure of $H_2$ is represented by $P_1(H_2)$, and the total pressure of the etching gas is represented by $P_{1\_Total}$. In this case, $P_{1\_Total}=P_1(N_2)+P_1(XeF_2)+P_1(H_2)$.

Likewise, assume that in the etching gas in the second etching step, the partial pressure of $N_2$ is represented by $P_2(N_2)$, the partial pressure of $XeF_2$ is represented by $P_2(XeF_2)$, the partial pressure of $H_2$ is represented by $P_2(H_2)$, and the total pressure of the etching gas is represented by $P_{2\_Total}$. In this case, $P_{2\_Total}=P_2(N_2)+P_2(XeF_2)+P_2(H_2)$.

In this embodiment, the partial pressure of $H_2$ in the etching gas in the second etching step is lower than that in the etching gas in the first etching step (that is, $P_1(H_2)>P_2(H_2)$).

(1.3 First Etching Step and its Experimental Result)

The first etching step described above will be verified with reference to FIGS. 4A to 4C. In the first etching step, a deposit can be formed on an exposed faces of the silicon nitride films 207. The deposit is not etched by $XeF_2$ and is deposited and formed on the exposed faces of the silicon nitride films 207 during the etching.

Figure 4A:
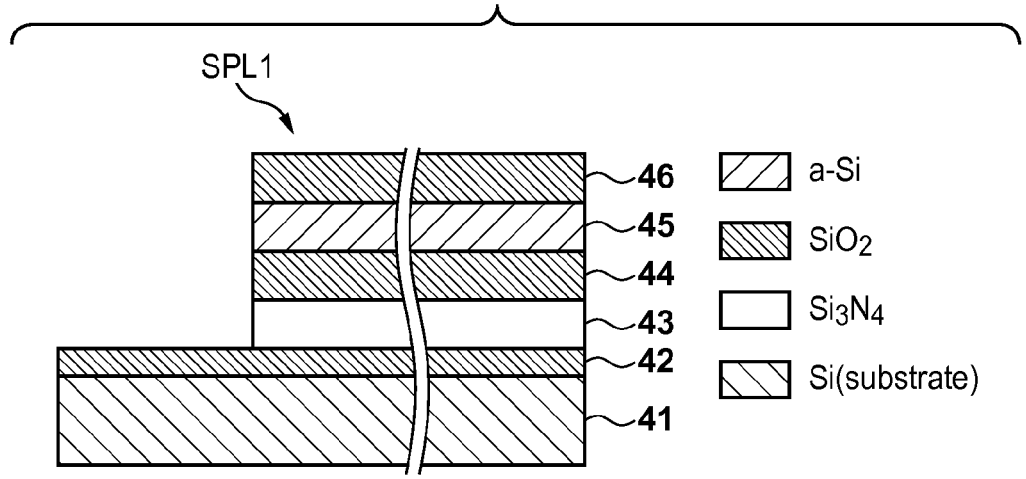
FIGS. 4A to 4C are views for explaining an example of the arrangement of an experimental sample.

FIG. 4A is a schematic view showing a sectional structure of a sample SPL1 used in the following experiment. The sample SPL1 has a silicon nitride member 43 (thickness: 500 nm) provided on a silicon oxide film 42 (300-nm thick oxide film) on a silicon substrate 41. The sample SPL1 also has an amorphous silicon member 45 (thickness: 500 nm) provided on a silicon oxide film 44 (thickness: 500 nm) on the silicon nitride member 43. The upper surface of the amorphous silicon member 45 is covered with a silicon oxide film 46 (thickness: 500 nm). Side surfaces of both the silicon nitride member 43 and the amorphous silicon member 45 are exposed. Several similar samples SPL1 were prepared, and the following experiment was conducted.

In an experimental example, both the first etching step and the second etching step described above were performed on the first sample (to be referred to as a "sample SPL1$_A$"). On the other hand, in a reference example, only the second etching step described above was performed on the second sample (to be referred to as a "sample SPL1$_B$").

Note that in the first etching step, the quantities of flow of $N_2$, $XeF_2$, and $H_2$ in the etching gas were respectively 52 sccm, 21 sccm, and 20 sccm. In addition, the total pressure in the chamber 101 was 9.5 Torr. The partial pressures of the respective gases were respectively given as $P_1(N_2)$=5.3 Torr, $P_1(XeF_2)$=2.2 Torr, and $P_1(H_2)$=2 Torr. Furthermore, the effective etching time (the interval between T302 and T303 in FIG. 3) was set to 3 min.

Note that in the second etching step, the quantities of flow of $N_2$, $XeF_2$, and $H_2$ in the etching gas were respectively 52 sccm, 21 sccm, and 0 sccm (not using $H_2$). In addition, the total pressure in the chamber 101 was 9.5 Torr. The partial pressures of the respective gases were respectively given as $P_1(N_2)$=6.7 Torr, $P_1(XeF_2)$=2.8 Torr, and $P_1(H_2)$=0 Torr. Furthermore, the effective etching time (the interval between T306 and T307 in FIG. 3) was set to 3 min.

Figure 4B:
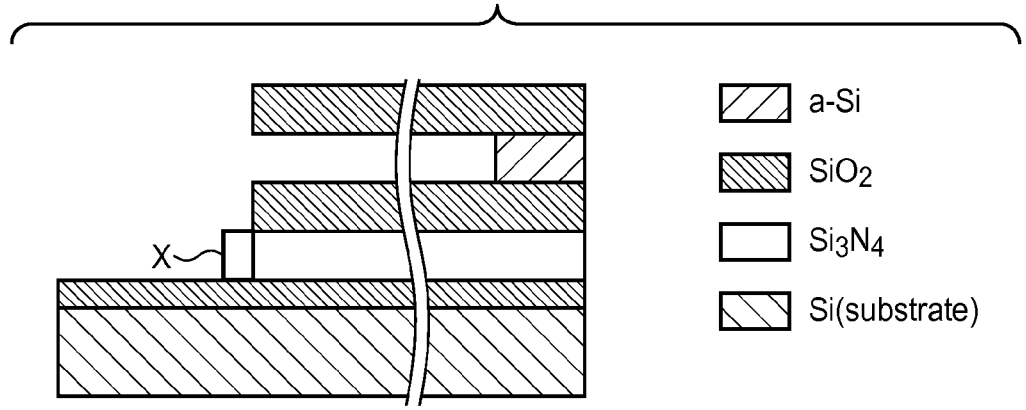
Figure 4C:
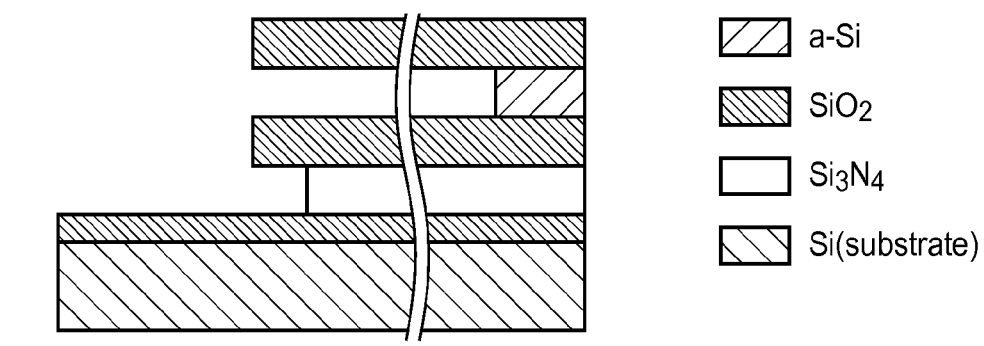

FIG. 4B shows a sectional structure of the sample SPL1$_A$ obtained in the above experimental example. FIG. 4C shows a sectional structure of the sample SPL1$_B$ obtained in the above reference example. The amorphous silicon member 45 was removed from each of the samples SPL1$_A$ and SPL1$_B$ by $XeF_2$ in the etching gas. In this case, in the sample SPL1$_B$, part (part of the exposed face side) of the silicon nitride member 43 was etched. In contrast to this, in the sample SPL1$_A$, a deposit X was formed on the exposed face of the silicon nitride member 43, and the silicon nitride member 43 was not etched. From this, it can be concluded that the deposit X functions as a protective film for preventing the silicon nitride member 43 from being etched.

Figure 5A:
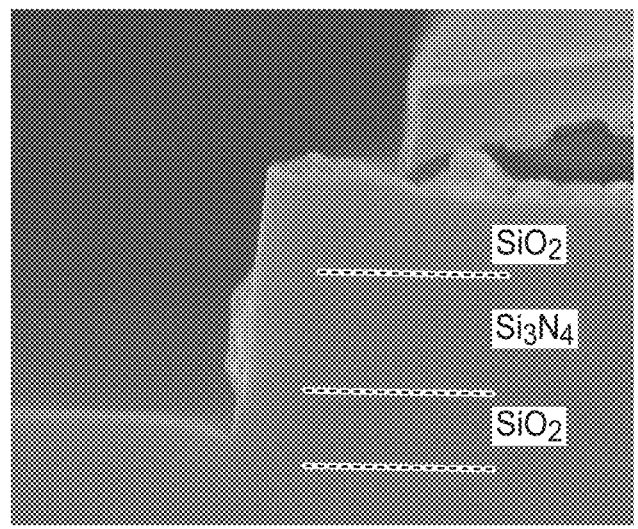
FIGS. 5A and 5B are views for explaining SEM photos of experimental results.
Figure 5B:
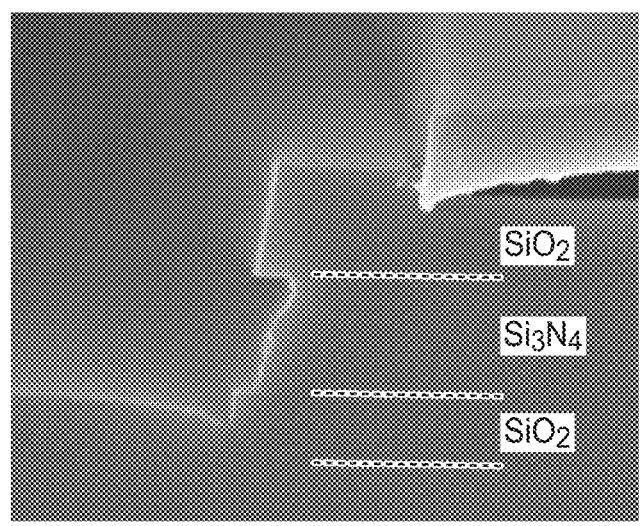

FIGS. 5A and 5B are SEM photos for explaining the above experimental results. FIG. 5A shows the experimental result after the etching based on the above experimental example (that is, after the execution of the first and second etching steps). FIG. 5B shows the experimental result after the etching based on the above comparative example (that is, after the execution of only the second etching step).

According to FIG. 5A, the deposit X is formed on the exposed face of the silicon nitride member, and the silicon nitride member is not etched. The deposit X was recognized at time T304 (FIG. 3) described above. In contrast to this, according to FIG. 5B, the silicon nitride member is etched by about 150 nm from the end portion.

It can be concluded from the above experimental results that once the deposit X is formed on the exposed face of the silicon nitride member, the silicon nitride member is not etched even if the partial pressure or quantity of flow of $H_2$ in the etching gas is decreased (or the supply of $H_2$ is stopped).

Note that a silicon nitride member is hardly etched by simply etching the silicon nitride member alone by using $XeF_2$. The silicon nitride member can be etched when a silicon member exists near it. It is therefore thought that the by-product generated by the above reaction formula originates from etching on the silicon nitride member. In addition, it is thought that the deposit X described above is formed on the exposed face of the silicon nitride member by four factors, namely, the exposed silicon member, the exposed silicon nitride member, $XeF_2$, and $H_2$. Since the deposit X is not formed on the surface of a silicon oxide film or silicon oxide member, it is thought that the deposit X is formed by the reactions between the by-product generated by reaction formula (1) described above, the silicon nitride member, and $H_2$.

(1.4 Study on Etching Conditions)

Etching conditions will be studied with reference to FIGS. 6A to 7B.

Figure 6A:
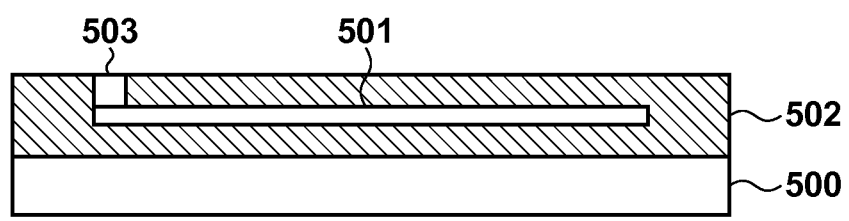
FIGS. 6A and 6B are views for explaining an example of the arrangement of an experimental sample.
Figure 6B:
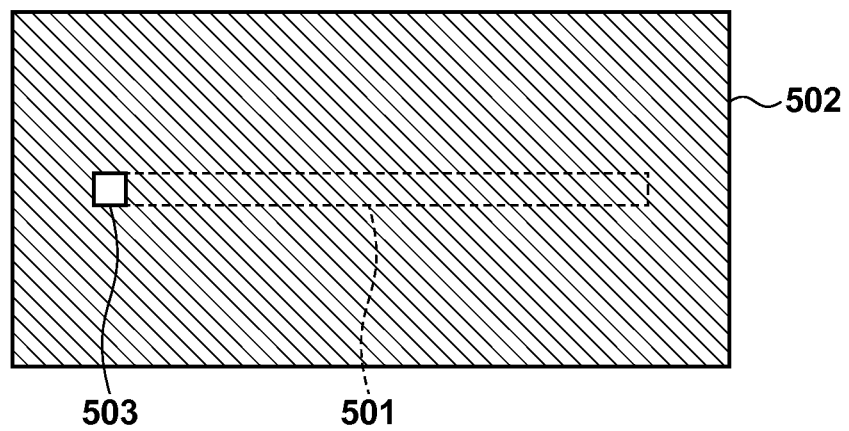

FIGS. 6A and 6B are schematic views each showing a sample SPL2 for the measurement of an etching rate. FIG. 6A is a sectional view of the sample SPL2. FIG. 6B is a top view of the sample SPL2.

The sample SPL2 has a structure ST including an amorphous silicon member 501 and a silicon oxide member 502 covering the amorphous silicon member 501 which are arranged on a base 500. The amorphous silicon member 501 has a rod-like shape having a width of 10 µm, a length of 200 µm, and a thickness of 100 nm. The silicon oxide member 502 is provided with an opening 503 to expose the upper surface of an end portion of the amorphous silicon member 501. The opening 503 has a size of 10 µm×10 µm. Several similar samples SPL2 were prepared, and an experiment was conducted, in which etching was performed under different etching conditions.

Figures 7A, 7B:
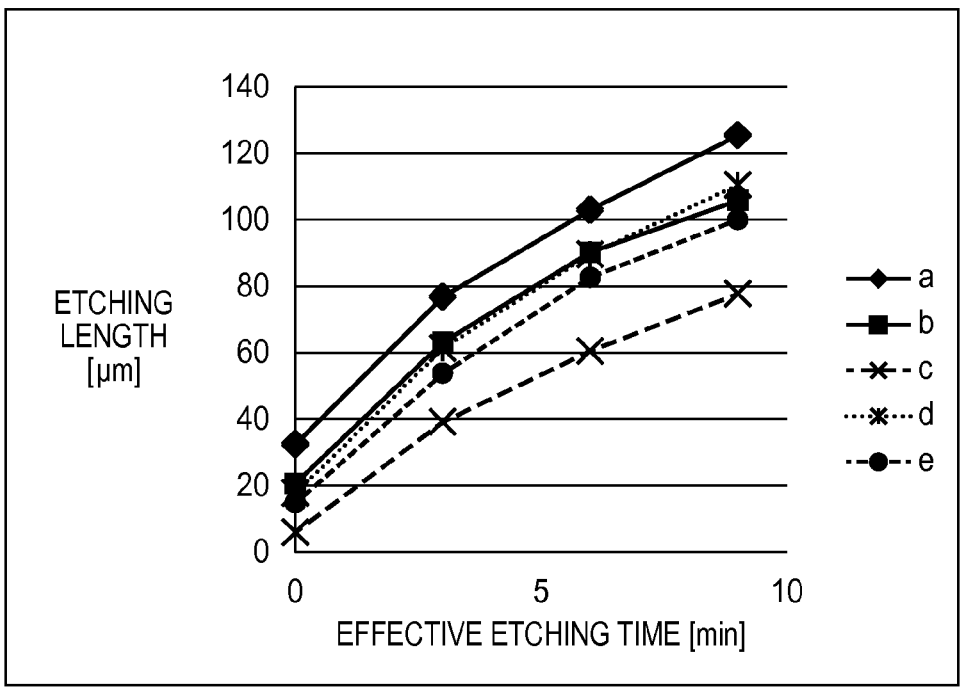
FIGS. 7A and 7B are views for explaining experimental conditions and experimental results.

FIG. 7A shows etching conditions a to e in this experiment. For example, the condition a was set such that the quantities of flow of $N_2$, $XeF_2$, and $H_2$ in the etching gas were respectively 52 sccm, 21 sccm, and 0 sccm, a total pressure $P\_{Total}$ in the chamber 101 was 9.5 Torr, and the partial pressures of the respective gases were respectively given as $P(N_2)$=6.7 Torr, $P(XeF_2)$=2.8 Torr, and $P(H_2)$=0 Torr. A description of the remaining conditions b to e will be omitted.

With regard to each of the conditions a to e, the effective etching time (the interval between T302 and T303 in FIG. 3) as a parameter was set to 0 min, 3 min, 6 min, and 9 min.

FIG. 7B is a graph on which the experimental results obtained under the conditions a to e are plotted. Referring to FIG. 7B, the ordinate represents the etching length of the amorphous silicon member 501, and the abscissa represents the effective etching time.

Note that the experimental result obtained when the effective etching time is 0 min indicates the etching length of the sample SPL2 etched in the interval between T301 and T302 and the interval between T303 and T304 (the intervals in which the pressure in the chamber 101 changes).

For example, with regard to the conditions a, b, and c, total pressures $P\_{Total}$ are equal to each other, and the quantities of flow of $H_2$ are different from each other. These experimental results reveal the dependence of the etching length of the amorphous silicon member 501 on the quantity of flow of $H_2$ or a partial pressure ratio $P(XeF_2)/P(H_2)$ between $XeF_2$ and $H_2$.

For example, with regard to the conditions a and d, the quantities of flow of the respective gases (not using $H_2$) are equal to each other, and the total pressures $P\_{Total}$ of the respective gases are different from each other. These experimental results reveal the $P(XeF_2)$ dependence of the etching length of the amorphous silicon member 501 when the quantity of flow of each gas is constant.

For example, with regard to the conditions c, d, and e, the partial pressures $P(XeF_2)$ are equal to each other, and the partial pressures $P(H_2)$ of $H_2$ are different from each other. These experimental results reveal the $P(H_2)$ dependence of the etching length of the amorphous silicon member 501 when $P(XeF_2)$ is constant.

With regard to the conditions b and e, the quantities of flow of the respective gases (not using $H_2$) are equal to each other, and the total pressure $P\_Total$ of the respective gases are different from each other. These experimental results reveal the $P\_Total$ dependence of the etching length of the amorphous silicon member 501 when the partial pressure ratio $P(XeF_2)/P(H_2)$ between $XeF_2$ and $H_2$ is constant.

In this case, according to the experimental results (FIG. 7B), the etching lengths of the amorphous silicon member 501 increase in the order of the condition a, the condition b or d, the condition e, and the condition c.

For example, as the partial pressure $P(XeF_2)$ of $XeF_2$ is increased, the etching rate of the amorphous silicon member 501 tends to increase. This can conclude that when $P_1(XeF_2)<P_2(XeF_2)$ is satisfied in the first and second etching steps (FIG. 3) described above, the etching rate of the silicon member in the second etching step becomes higher than that in the first etching step.

Note that the reaction expressed by reaction formula (1) described above is an endothermic reaction, and the etching rate increases as the stage temperature is raised. In addition, since the vapor pressure of $XeF_2$ monotonically increases with an increase in temperature, the vapor pressure of $XeF_2$ increases as the stage temperature is raised, and the partial pressure $P_1(XeF_2)$ or $P_2(XeF_2)$ of $XeF_2$ increases. Both the etching rates of the silicon members in the first and second etching steps increase.

In addition, for example, as the partial pressure ratio $P(XeF_2)/P(H_2)$ between $XeF_2$ and $H_2$ is increased, the etching rate of the amorphous silicon member 501 tends to increase. From this, it can be concluded that $P_1(XeF_2)/P_1(H_2)<P_2(XeF_2)/P_2(H_2)$ is satisfied in the first and second etching steps described above.

In addition, for example, as the partial pressure $P(H_2)$ of $H_2$ decreases while the partial pressure $P(XeF_2)$ of $XeF_2$ is constant, the etching rate of the amorphous silicon member 501 tends to increase. This can conclude that $P_1(H_2)>P_2(H_2)$ is preferably satisfied in the first and second etching steps described above.

Furthermore, for example, as the total pressure $P\_Total$ increases while the partial pressure ratio $P(XeF_2)/P(H_2)$ between $XeF_2$ and $H_2$ is constant, the etching rate of the amorphous silicon member 501 tends to increase. From this, it can be concluded that if $P_1(XeF_2)/P_1(H_2)=P_2(XeF_2)/P_2(H_2)$, $P_{1\_Total}<P_{2\_Total}$ is preferably satisfied in the first and second etching steps.

An etching condition in the second etching step may be set, as needed, so as to increase the etching rate of the silicon member as compared with the first etching step.

Note that according to FIG. 7B, as the etching time increases, the etching rate decreases (the inclination of each plotted line decreases). This may be because as the etching time increases, the etching position of the amorphous silicon member 501 shifts away from the opening 503, and it is difficult for the etching gas to reach the etching position. Therefore, the effective etching time (or simply the etching time) may be set within 3 min.

(1.5 Summary of First Embodiment)

As described above, in this embodiment, after a substrate on which a silicon member and a silicon nitride member are exposed is prepared, two types of etching (the first and second etching steps) are performed under different etching conditions.

In the first etching step, the silicon member is etched by using an etching gas containing $XeF_2$ and $H_2$. This increases the selectivity of the silicon member to the silicon nitride member, thereby preventing the silicon nitride member from being etched. In this case, letting the etching gas contain $H_2$ will decrease the etching rate of the silicon member.

For this reason, in the second etching step, the silicon member is etched by using an etching gas containing $XeF_2$ and having a lower partial pressure or smaller quantity of flow of $H_2$ than in the first etching step. The second etching step is performed after a deposit is formed on the exposed face of the silicon nitride member during the first etching step. This deposit functions as a protective layer for the silicon nitride member, and protects the silicon nitride member from the etching gas.

This embodiment is therefore advantageous in increasing the etching selectivity of the silicon member while maintaining the etching rate of the silicon member. This can shorten the time required to manufacture a semiconductor device and reduce the manufacturing cost. Although the silicon nitride member has been exemplified, the embodiment can be applied to any compound member containing at least nitrogen and silicon.

(2. Second Embodiment)

Figure 8:
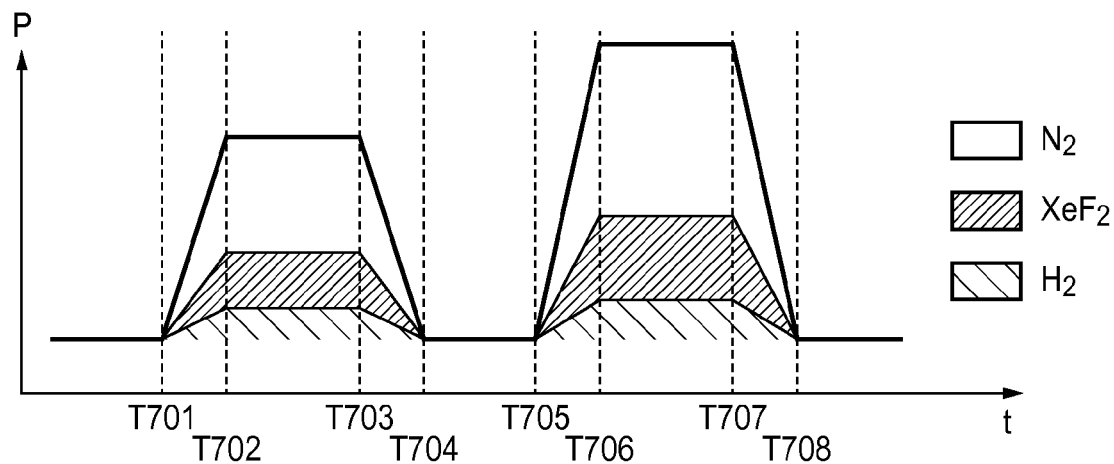
FIG. 8 is a timing chart for explaining an example of an etching step.

The second embodiment will be described with reference to FIG. 8. Like FIG. 3 (the first embodiment described above), FIG. 8 shows a timing chart for explaining etching steps according to this embodiment. An operation at times T701 to T708 in FIG. 8 corresponds to that at T301 to T308 in FIG. 3. This embodiment mainly differs from the first embodiment in that the etching rate of a silicon member in the second etching step is increased higher than that in the first etching step under the condition of $P_1(H_2) \leq P_2(H_2)$.

In this embodiment, etching conditions in the first and second etching steps satisfy $P_1(XeF_2)/P_1(H_2)<P_2(XeF_2)/P_2(H_2)$, and $P_1(H_2) \leq P_2(H_2)$. That is, $P_2(XeF_2)/P_1(XeF_2)>P_2(H_2)/P_1(H_2) \geq 1$. This expression will be referred to as expression (2).

In this case, according to the above experimental results (FIG. 7B), even if $P_1(H_2)=P_2(H_2)$, the etching rate of the silicon member in the second etching step becomes higher than that in the first etching step as long as $P_2(XeF_2)>P_1(XeF_2)$. That is, if $P_2(XeF_2)/P_1(XeF_2)>P_2(H_2)/P_1(H_2)=1$, the etching rate in the second etching step becomes higher than that in the first etching step. This expression will be referred to as expression (3).

In addition, if $P_1(XeF_2)/P_1(H_2)<P_2(XeF_2)/P_1(H_2)$, the etching rate of the silicon member in the second etching step becomes higher than that in the first etching step. Furthermore, if $P_{1\_Total}<P_{2\_Total}$, the etching rate in the second etching step becomes higher than that in the first etching step. That is, if $P_2(XeF_2)/P_1(XeF_2)>P_2(H_2)/P_1(H_2)>1$, the etching rate in the second etching step becomes higher than that in the first etching step. This expression will be referred to as expression (4).

In this case, expression (2) as a condition in this embodiment is a combination of expressions (3) and (4). Therefore, if expression (2) is satisfied, that is, even if $P_1(H_2) \leq P_2(H_2)$, the etching rate of the silicon member in the second etching step becomes higher than that in the first etching step as long as $P_1(XeF_2)/P_1(H_2)<P_2(XeF_2)/P_2(H_2)$.

As described above, this embodiment can also obtain the same effects as those of the first embodiment.

(3. Third Embodiment)

Figure 9:
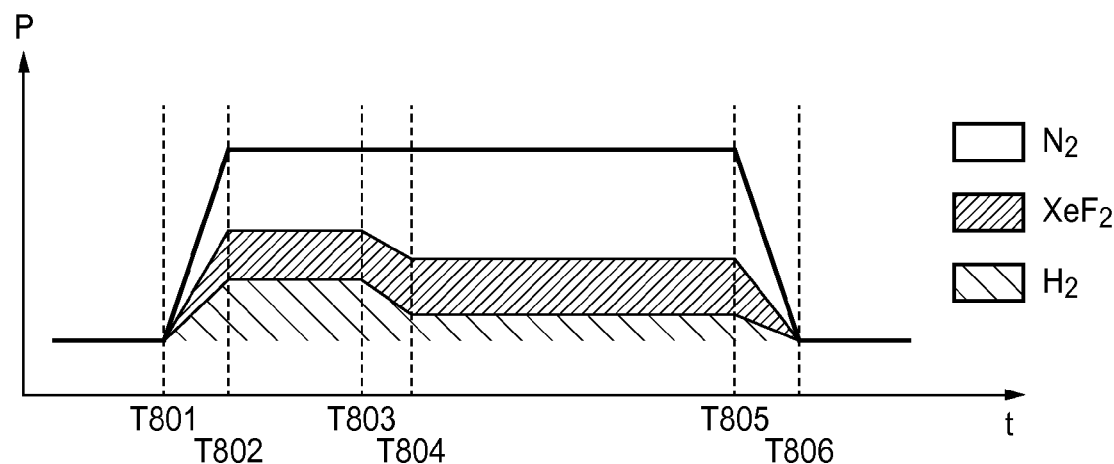
FIG. 9 is a timing chart for explaining an example of an etching step.

The third embodiment will be described with reference to FIG. 9.

Like FIG. 3 (the first embodiment described above), FIG. 9 shows a timing chart for explaining etching steps according to this embodiment. The embodiment differs from the first embodiment in that the step of setting the interior of a chamber 101 in a nearly vacuum state between the first and second etching steps is omitted. That is, according to this embodiment, as the quantity of flow or partial pressure of each gas in an etching gas is changed in the chamber 101, a shift is made from the first etching step to the second etching step.

A valve v0 is gradually closed from time T801, and an etching gas is supplied into the chamber 101 in the interval between times T801 and T802. Thereafter, at times T802 and T803, the valve v0 is partially open to maintain the pressure in the chamber 101 almost constant (for example, 9.5 Torr), and the first etching step is performed.

Subsequently, at times T803 and T804, the partial pressures of the respective gases in the etching gas supplied into the chamber 101 are gradually changed by, for example, regulating valves v1 to v4. Thereafter, at times T804 and T805, the second etching step is performed. The pressure in the chamber 101 is reduced by gradually closing the valve v0 from time T805. At time T806, the valve v0 is fully open to set the interior of the chamber 101 in a nearly vacuum state.

As described above, this embodiment can obtain the same effects as those of the first embodiment, and it is possible to omit the step of setting the interior of the chamber 101 in a nearly vacuum state between the first and second etching steps. Note that the etching conditions in the first and second etching steps may be the same as those in the first embodiment or the second embodiment.

(4. Others)

Although the three preferred embodiments have been exemplified above, the present invention is not limited to them. The present invention can be partially changed, as needed, without departing from the scope of the present invention, and can be implemented by other embodiments, in accordance with objects and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-012764, filed Jan. 27, 2014, which is hereby incorporated by reference herein in its entirety.

What is claimed is:

1. A method of manufacturing a semiconductor device, the method comprising:
a first etching step of etching a substrate on which a silicon member, a silicon oxide member, and a compound member containing nitrogen and silicon are exposed, by using a first gas containing $XeF_2$ and $H_2$, wherein, in the first etching step, a deposit is formed on an exposed surface of the compound member while at least part of a surface of the silicon oxide member is not covered by the deposit to be exposed; and
a second etching step of etching the substrate by using a second gas containing $XeF_2$ after the first etching step, the deposit formed in the first etching step functioning as a protective layer for suppressing etching of the compound member in the second etching step,
wherein the second gas used in the second etching step satisfies at least one of:
a condition that the second gas used in the second etching step is lower in a partial pressure of $H_2$ than the first gas used in the first etching step, and
a condition that the second gas used in the second etching step is smaller in a quantity of flow of $H_2$ than the first gas used in the first etching step, and
wherein, for each of the first gas and the second gas, $N_2$ is used as a carrier gas for sublimating solid $XeF_2$.

2. The method according to claim 1, wherein letting $P_1(H_2)$ and $P_1(XeF_2)$ be a partial pressure of $H_2$ and a partial pressure of $XeF_2$, respectively, in the first gas in the first etching step and $P_2(H_2)$ and $P_2(XeF_2)$ be a partial pressure of $H_2$ and a partial pressure of $XeF_2$, respectively, in the second gas in the second etching step $$P_1(XeF_2)/P_1(H_2) < P_2(XeF_2)/P_2(H_2).$$

3. The method according to claim 1, wherein letting $P_1(XeF_2)$ be a partial pressure of $XeF_2$ in the first gas in the first etching step and $P_2(XeF_2)$ be a partial pressure of $XeF_2$ in the second gas in the second etching step, $$P_1(XeF_2) < P_2(XeF_2).$$

4. The method according to claim 1, wherein letting $P_1(H_2)$ and $P_1(XeF_2)$ be a partial pressure of $H_2$ and a partial pressure of $XeF_2$, respectively, in the first gas in the first etching step, $P_{1\_Total}$ be a total gas pressure in the first etching step, $P_2(H_2)$ and $P_2(XeF_2)$ be a partial pressure of $H_2$ and a partial pressure of $XeF_2$, respectively, in the second gas in the second etching step, and $P_{2\_Total}$ be a total gas pressure in the second etching step, $$P_1(XeF_2)/P_1(H_2) = P_2(XeF_2)/P_2(H_2), \text{ and}$$
$$P_{1\_Total} < P_{2\_Total}.$$

5. The method according to claim 1, wherein the second gas contains $H_2$ whose partial pressure is 0.

6. The method according to claim 1, wherein the second gas contains $H_2$ whose quantity of flow is 0.

7. The method according to claim 1, wherein the first etching step and the second etching step are performed at a temperature within a range of $-5°$ C. to $40°$ C.

8. The method according to claim 1, wherein a time of the first etching step falls within 3 min.

9. The method according to claim 1, wherein the first etching step and the second etching step are performed by using a single chamber, and
wherein the method further comprises a step of reducing a pressure in the chamber by stopping supply of a gas into the chamber after the first etching step and before the second etching step.

10. The method according to claim 1, wherein the first etching step and the second etching step are performed by using a single chamber, and
wherein a shift is made to the second etching step after the first etching step while changing at least one of quantities of flow of $XeF_2$ and $H_2$ and partial pressures of $XeF_2$ and $H_2$ of a gas supplied into the chamber.

11. The method according to claim 1, wherein, in the second etching step, the quantity of flow of $H_2$ in the second gas is increased and the partial pressure of $H_2$ in the second gas is decreased, relative to the first gas used in the first etching step.

12. The method according to claim 1, wherein the silicon oxide member is located between the silicon member and the compound member.

13. The method according to claim 1, further comprising preparing the substrate, before the first etching step, the silicon member being provided on the substrate, the silicon oxide being provided on the silicon member, and the compound member being provided on silicon oxide,
wherein, after the second etching step, the silicon member is removed such that the silicon oxide and the compound member are fixed above the substrate.

14. The method according to claim 13, wherein the semiconductor device includes a bolometer comprising a bolometer film for detecting a temperature change, the bolometer film being provided above the substrate covered by the compound not to be exposed.

* * * * *